(12) United States Patent
Jung et al.

(10) Patent No.: US 7,768,053 B2
(45) Date of Patent: *Aug. 3, 2010

(54) SEMICONDUCTOR DEVICE WITH ASYMMETRIC TRANSISTOR AND METHOD FOR FABRICATING THE SAME

(75) Inventors: Tae-Woo Jung, Ichon-shi (KR); Sang-Won Oh, Ichon-shi (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/249,443

(22) Filed: Oct. 10, 2008

(65) Prior Publication Data

US 2009/0039402 A1    Feb. 12, 2009

Related U.S. Application Data

(62) Division of application No. 11/319,380, filed on Dec. 29, 2005, now Pat. No. 7,449,401.

(30) Foreign Application Priority Data

Jan. 31, 2005    (KR) .......................... 2005-0008770

(51) Int. Cl.
*H01L 27/108* (2006.01)
(52) U.S. Cl. ...................... 257/296; 257/213; 257/241; 257/288; 257/330; 257/E27.084; 257/E21.218
(58) Field of Classification Search ................ 257/213, 257/241, 288, 296, 330, E27.084, E21.218
See application file for complete search history.

(56) References Cited

U.S. PATENT DOCUMENTS 5,210,056 A    5/1993    Pong et al.

(Continued)

FOREIGN PATENT DOCUMENTS

KR    10-2001-017172 A    3/2001

(Continued)

OTHER PUBLICATIONS

Notice of Preliminary Rejection from the Korean Intellectual Property Office, dated Jan. 15, 2007, in counterpart Korean Patent Application No. 2005-008770.

(Continued)

*Primary Examiner*—Long K Tran
(74) *Attorney, Agent, or Firm*—IP & T Law Firm PLC

(57) ABSTRACT

A semiconductor device with an asymmetric transistor and a method for fabricating the same are provided. The semiconductor device includes: a substrate having a plurality of first active regions, at least one second active region, and a plurality of device isolation regions; gate patterns formed in a step structure over a border region between individual first active regions and second active region, wherein one side of the individual gate pattern is formed over a portion of the individual first active region, and the other side of the individual gate pattern is formed over a portion of the second active region; spacers formed on lateral walls of the gate patterns; first cell junction regions formed in the first active regions, for connecting to storage nodes; and a second cell junction region formed in the second active region, for connecting to a bit line.

4 Claims, 9 Drawing Sheets

U.S. PATENT DOCUMENTS

| | | |
|---|---|---|
| 5,843,846 A | 12/1998 | Nguyen et al. |
| 6,261,910 B1 | 7/2001 | Ahn et al. |
| 6,465,831 B1 | 10/2002 | Park et al. |
| 7,378,703 B2 * | 5/2008 | Jung et al. ................ 257/296 |

FOREIGN PATENT DOCUMENTS

| | | |
|---|---|---|
| KR | 10-2006-0075424 | 7/2006 |
| KR | 10-2006-0076533 | 7/2006 |
| KR | 10-2006-0087875 A | 8/2006 |

OTHER PUBLICATIONS

Office Action mailed on Apr. 9, 2007 in related U.S. Appl. No. 11/320,884.

Notice of Allowance issued from the Chinese Patent Office on Aug. 19, 2009.

* cited by examiner

SEMICONDUCTOR DEVICE WITH ASYMMETRIC TRANSISTOR AND METHOD FOR FABRICATING THE SAME This is a divisional of application Ser. No. 11/319,380 filed on Dec. 29, 2005 now U.S. Pat. No. 7,449,401, which claims the benefit of priority of Korean patent application No. KR 2005-0008770, filed in the Korean Patent Office on Jan. 31, 2005. The entire contents of both applications are incorporated herein by reference in their entirety.

TECHNICAL FIELD

The present invention relates to a method for fabricating a semiconductor device; and, more particularly, to a semiconductor device with an asymmetric transistor and a method for fabricating the same.

DESCRIPTION OF RELATED ARTS

In a dynamic random access memory (DRAM), a capacitor characteristic has been improved to enhance a refresh characteristic by increasing a refresh time. However, as semiconductor devices have become more highly integrated, it is becoming increasingly difficult to increase the refresh time by improving the capacitor characteristic only.

Generally, a threshold voltage (Vt) changes according to a channel length, and the refresh characteristic of a cell changes accordingly. In order to improve the refresh characteristic, the channel length needs to be increased, and thus, a method for increasing a critical dimension (CD) of a gate electrode is typically used.

However, if the critical dimension of the gate electrode is increased to increase the channel length, the threshold voltage will abruptly decrease due to relatively concentrated electric fields. Moreover, as the critical dimension of the gate electrode increases, the degree of integration of the cell also decreases.

According to the recent large scale of integration in semiconductor devices, a decrease in the critical dimension of the gate electrode is inevitable, and thus, the channel length is also decreased resulting in a short channel effect that deteriorates the refresh characteristic of the capacitor. Herein, the short channel effect refers to an abrupt decrease in the threshold voltage.

FIG. 1 is a cross-sectional view illustrating a conventional semiconductor device structure.

Referring to FIG. 1, a device isolation region 12 in a shallow trench isolation (STI) structure is formed in a substrate 11. Then, gate patterns G are formed on the substrate 11. Herein, the gate patterns G include a gate insulation layer 13, a gate electrode 14 and a hard mask 15, formed in sequential order. Also, gate spacers S are formed on both lateral walls of the gate patterns G. Herein, each of the gate spacers S includes an oxide layer 16 and a nitride-based layer 17.

Subsequently, a first junction region 18 and a second junction region 19 are formed by implanting ions onto the substrate 11 disposed between the gate patterns G. The first junction region 18 is a bit line contact region whereon a bit line is to be formed, and the second junction region 19 is a storage node contact region whereon a storage node is to be formed.

As shown in FIG. 1, if a transistor, wherein the gate electrode 14 is formed directly on the substrate 11 and the channel length is limited by the critical dimension of the gate electrode 14 (hereinafter referred to as the flat transistor), is used as a cell transistor in a DRAM, relatively concentrated electric fields are generated. As discussed above, the relatively concentrated electric fields result in serious defects, such as a decreased threshold voltage of the cell transistor.

For example, in the case where a flat transistor is used as the cell transistor, a doping concentration level of a dopant that determines the threshold voltage of the cell transistor (C-VT) is estimated as $1.7 \times 10^{13}$ cm$^{-3}$, the electric field as 0.58 MV/cm and a refresh time (S-tREF) as 190 ms.

Thus, the decrease of the refresh time below 190 ms may cause serious limitations such as a decreased yield rate in 100 nm level DRAM fabrication.

SUMMARY

Consistent with the present invention, there is provided a semiconductor device capable of preventing a cell threshold voltage from decreasing, and a method for fabricating the same.

Consistent with the present invention, there is further provided a semiconductor device, including: a substrate having a plurality of first active regions, at least one second active region, and a plurality of device isolation regions; gate patterns formed in a step structure over a border region between individual first active regions and second active region, wherein one side of the individual gate pattern is formed over a portion of the individual first active region, and the other side of the individual gate pattern is formed over a portion of the second active region; spacers formed on lateral walls of the gate patterns; first cell junction regions formed in the first active regions, for connecting to storage nodes; and a second cell junction region formed in the second active region, for connecting to a bit line.

Another aspect consistent with the present invention provides a method for fabricating a semiconductor device, including: preparing a substrate structure having first active regions and a second active region; rounding a border region between the individual first active regions and the second active region; forming a gate insulation layer over the substrate structure; forming gate patterns in a step structure on the gate insulation layer over the border region between the individual first active regions and the second active region, wherein one side of the individual gate pattern is formed over a portion of the individual first active region, and the other side of the individual gate pattern is formed over a portion of the second active region; forming spacers on lateral walls of the gate patterns; forming first cell junction regions in the first active regions; and forming a second cell junction region in the second active region.

BRIEF DESCRIPTION OF THE DRAWINGS

The above and other objects and features consistent with the present invention will become better understood with respect to the following description of the specific embodiments given in conjunction with the accompanying drawings, in which.

DETAILED DESCRIPTION

A semiconductor device with an asymmetric transistor and a method for fabricating the same consistent with the present invention will be described in detail with reference to the accompanying drawings.

Figure 1:
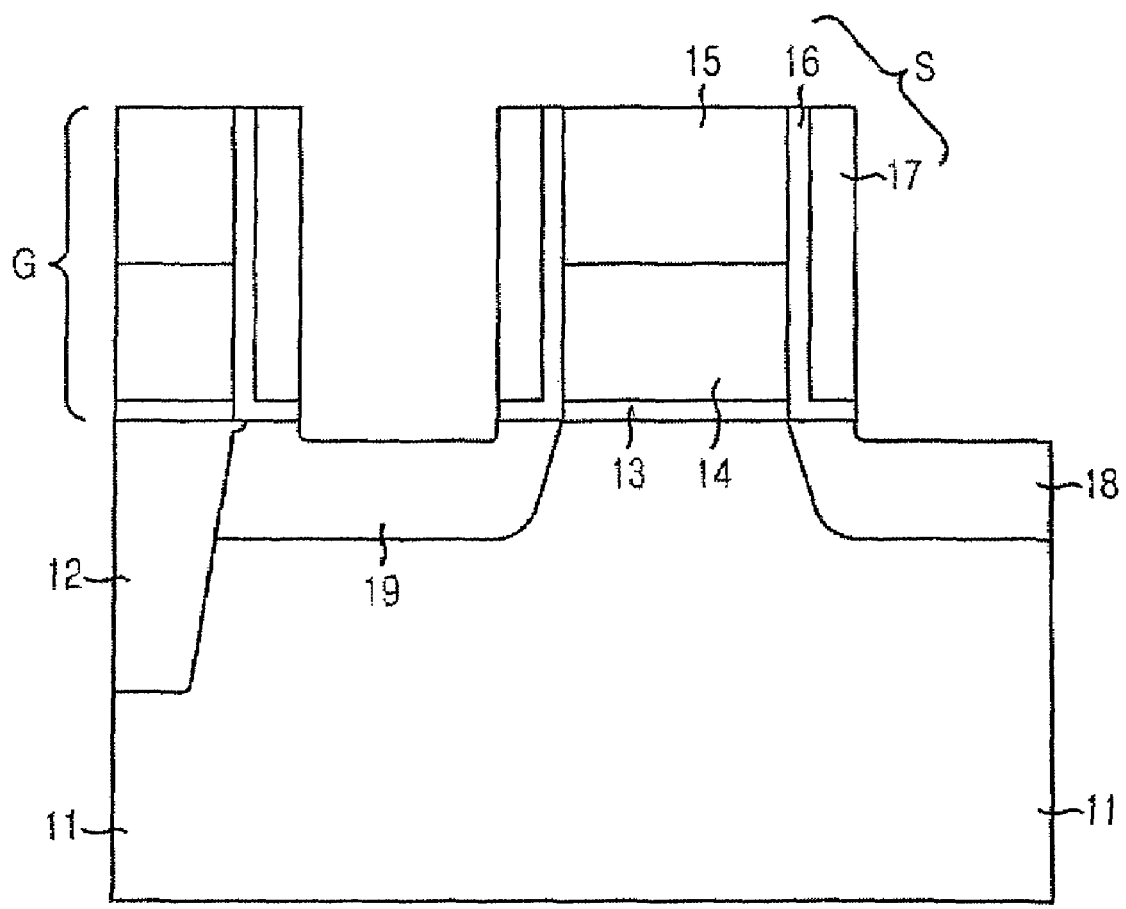
FIG. 1 is a cross-sectional view illustrating a structure of a conventional semiconductor device.
Figure 2:
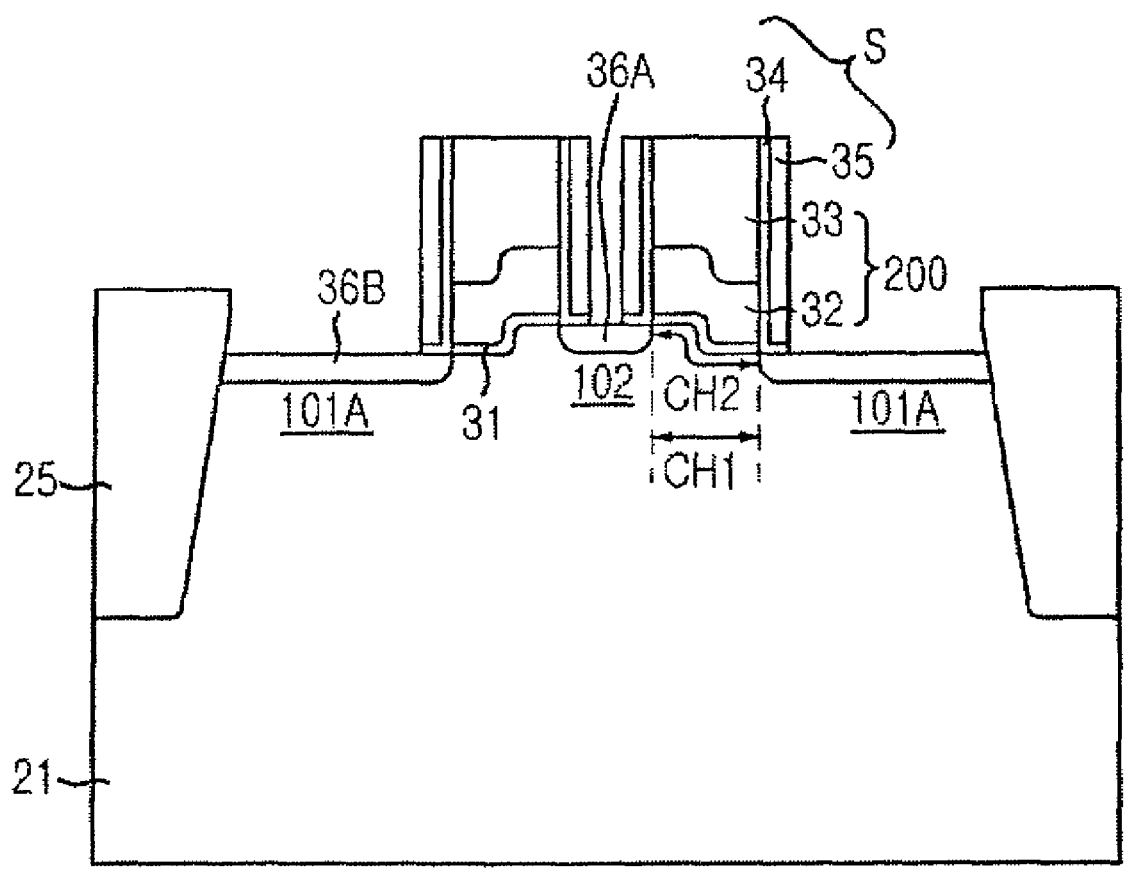
FIG. 2 is a cross-sectional view illustrating a structure of a semiconductor device including an asymmetric transistor consistent with the present invention.

FIG. 2 is a cross-sectional view illustrating a structure of a semiconductor device in accordance with a specific embodiment consistent with the present invention.

As shown, the semiconductor device consistent with the present invention includes: a substrate 21; recessed first active regions 101A formed in predetermined portions of the substrate 21; a second active region 102 formed in another predetermined portion of the substrate 21, wherein the second active region 102 is formed to protrude above the recessed first active regions 101A; device isolation regions 25 in contact with the recessed first active regions 101A; gate patterns 200 formed on the substrate 21, each gate pattern 200 partially disposed on the corresponding recessed first active regions 101A and on the second active region 102, wherein one side of the individual gate pattern 200 is extended up to a portion of the individual recessed first active region 101A, and the other side of the individual gate pattern 200 is extended up to a portion of the second active region 102, and thereby having a step structure; gate spacers S formed on both lateral walls of the gate patterns 200; first cell junction regions 36B each formed in the corresponding recessed first active regions 101A; and a second cell junction region 36A formed in the second active region 102. The gate spacers S include an oxide layer 34 and a nitride layer 35. Herein, a gate oxide layer 31 is formed below the gate patterns 200, and the gate patterns 200 include a gate electrode 32 and a hard mask 33 formed on the gate oxide layer 31. Also, the first cell junction regions 36B and the second cell junction region 36A are doped with N-type impurities.

As shown in FIG. 2, the recessed first active regions 101A and the second active region 102 have a height difference ranging from approximately 200 Å to approximately 600 Å, and this height difference causes a channel length to be increased, wherein the channel length is defined below the gate patterns 200. That is, because the gate patterns 200 are formed partially over the recessed first active regions 101A and the second active region 102, the amount that the channel length is lengthened may be equal to the height difference between the individual recessed first active region 101A and the second active region 102. Thus, referring to the channel length of a conventional flat transistor as 'CH1' and the channel length of the transistor in accordance with the specific embodiment of this invention as 'CH2', 'CH2' is longer than 'CH1' by the depth of the recessed first active regions 101A.

Furthermore, the first cell junction regions 36B are formed in the recessed first active regions 101A which are formed at lower regions than the second active region 102. Herein, storage nodes will be connected to the first cell junction regions 36B. Also, the second cell junction region 36A is formed in the second active region 102. Herein, a bit line will be connected to the second cell junction region 36A.

Moreover, a height difference occurs between the recessed first active regions 101A and the device isolation regions 25. Herein, the height difference ranges from approximately −50 Å to approximately +150 Å. The occurrence of the height difference between the recessed first active regions 101A and the device isolation regions 25 is determined by an etching process for a recess structure and a number of follow-up cleaning processes for forming the recessed first active regions 11A, as further described below.

Referring to FIG. 2, the cell transistor in this invention includes gate patterns 200 formed in a step-gate structure. Also, the second cell junction region 36A working as a source (or a drain) and the first cell junction regions 36B working as the drains (or the sources) are formed respectively in the second active region 102, and in each of the recessed first active regions 101A, resulting in the cell transistor in this embodiment having an asymmetric structure.

FIGS. 3A to 3G are cross-sectional views illustrating a method for fabricating the semiconductor device including the asymmetric transistor in FIG. 2. It should be noted that like reference numerals denote like elements even in different drawings.

Figure 3A:
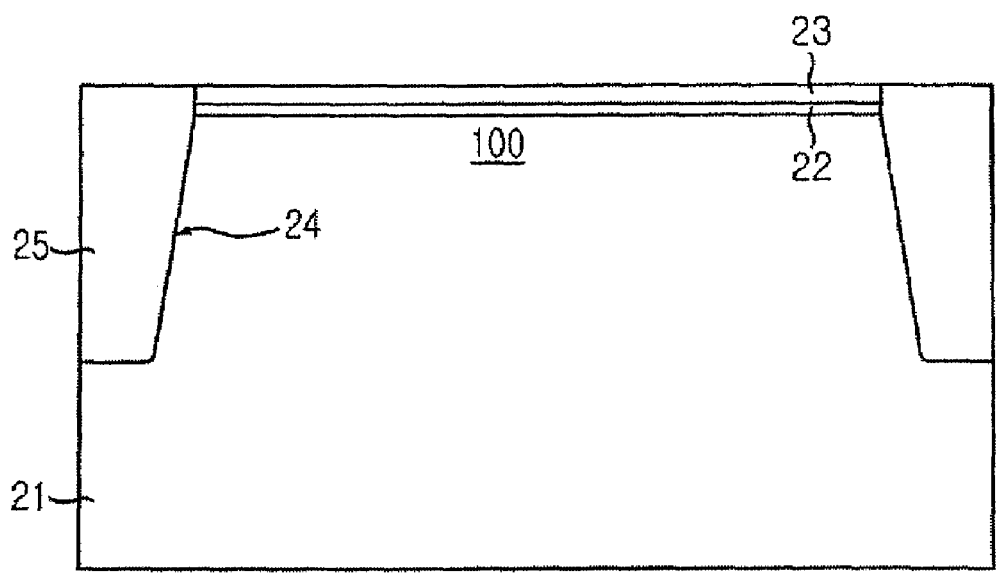
FIGS. 3A to 3G are cross-sectional views illustrating a method for fabricating the semiconductor device including the asymmetric transistor in FIG. 2.

As shown in FIG. 3A, a pad oxide layer 22 and a pad nitride layer 23 are sequentially formed on a substrate 21. Herein, the pad nitride layer 23 works as an etch stop layer as well as a polish stop layer in a chemical mechanical polishing (CMP) process to be followed later in the formation process. Preferably, the pad oxide layer 22 is formed by employing a silicon oxide ($SiO_2$) layer in a thickness ranging from approximately 50 Å to approximately 100 Å, and the pad nitride layer 23 may be formed by employing a silicon nitride ($Si_3N_4$) layer in a thickness ranging from approximately 700 Å to approximately 1,400 Å.

Next, a first photoresist layer is formed over the pad nitride layer 23, and then the above resulting substrate structure is patterned by a photo-exposure and developing process to form an ISO mask, although not illustrated. Then, the pad nitride layer 23 and the pad oxide layer 22 are sequentially etched by utilizing the ISO mask as an etch barrier.

Then, after the ISO mask is removed, the pad oxide layer 22 is etched by utilizing the pad nitride layer 23 as a hard mask. Next, exposed portions of the substrate 21, that is, device isolation regions are etched to form trenches 24.

Subsequently, a gap-fill insulation layer 25 is formed over the above resulting substrate structure, filling the trenches 24, and then the CMP process is performed on the above resulting substrate structure. Herein, the pad nitride layer 23 works as the polish stop layer during the CMP process, and as it is generally known, a lateral wall oxidation and a liner nitride layer process can be performed before forming the gap-fill insulation layer 25. Also, the gap-fill insulation layer 25 is an oxide layer formed by employing a high density plasma (HDP) method.

Since the gap-fill insulation layer 25 works as a device isolation region, the gap-fill insulation layer 25 is referred as the device isolation regions 25 hereinafter. The rest of the substrate 21 is defined as an active region 100 by the device isolation regions 25, and the surface of the active region 100 is flat.

Figure 3B:
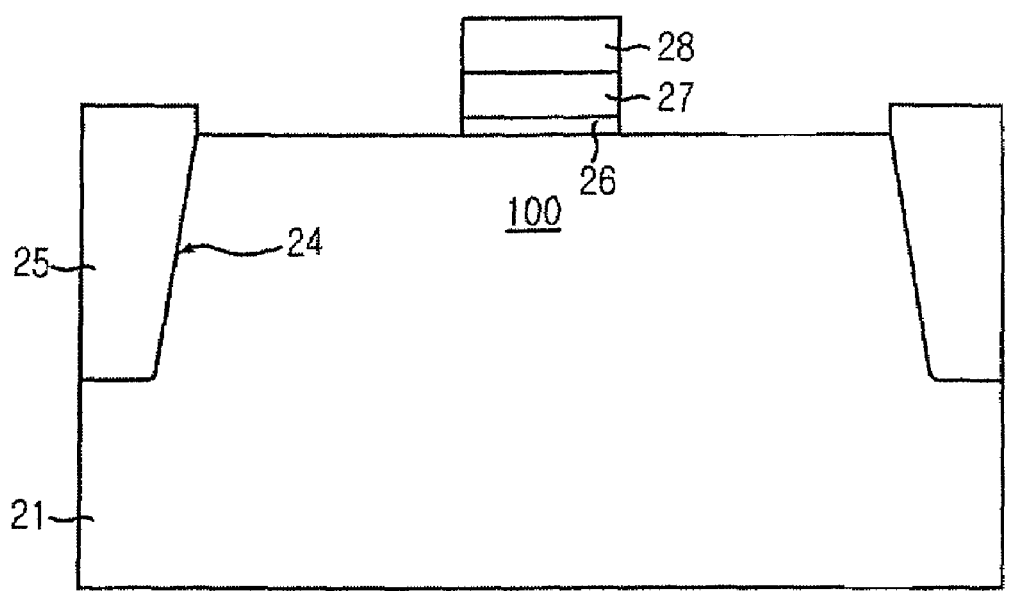

As shown in FIG. 3B, the pad nitride layer 23 and the pad oxide layer 22 are stripped. Herein, the pad nitride layer 23 is stripped by using phosphoric acid ($H_3PO_4$), and the pad oxide layer 22 is stripped by using hydrogen fluoride (HF).

Furthermore, a cell oxidation process is performed on the active region 100 to form an oxide layer 26 having a thickness ranging from approximately 50 Å to approximately 100 Å.

Moreover, an organic anti-reflective coating layer 27 is formed on the oxide layer 26. Then, a second photoresist layer is formed on the organic anti-reflective coating layer 27, and then the above resulting substrate structure is patterned by a photo-exposure and developing process to form a mask 28.

Herein, the mask 28 works as a recess mask to recess predetermined portions of the active region 100 to have a uniform thickness whereon the storage nodes are to be connected to.

Then, the organic anti-reflective coating layer 27 and the oxide layer 26 are sequentially etched by utilizing the mask 28 as an etch barrier. An etch target thickness of the organic anti-reflective coating layer 27 can be approximately 600 Å, and the oxide layer 26 can be formed to have a thickness of approximately 50 Å.

Herein, the organic anti-reflective coating layer 27 is individually etched using a mixed gas of carbon tetrafluoride ($CF_4$), trifluoromethane ($CHF_3$) and oxygen ($O_2$) An etch selectivity ratio between the organic anti-reflective coating layer 27 and the HDP oxide layer used as the device isolation regions 25 is controlled to be approximately 1:1 to thereby control the height of the device isolation regions 25 and the active region 100.

Figure 3C:
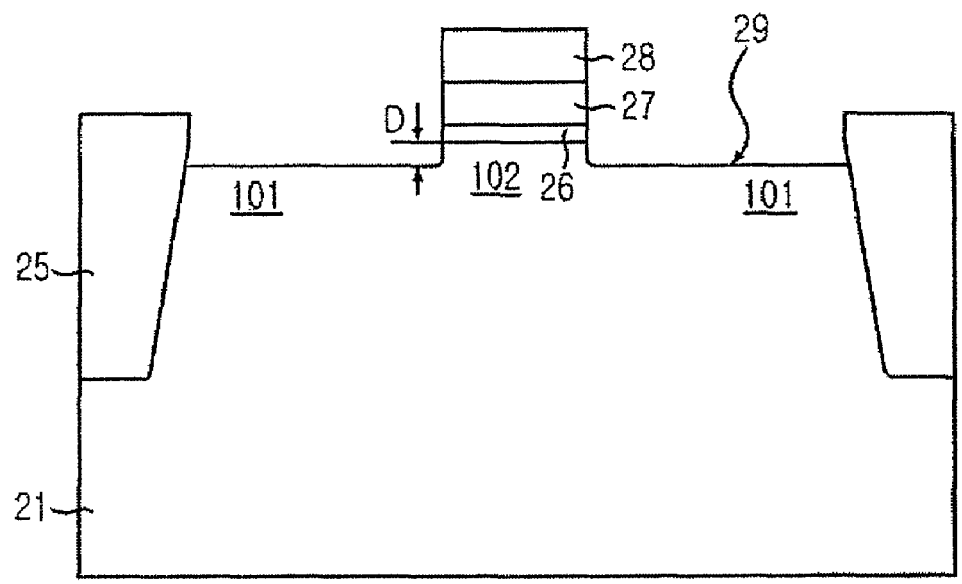

As shown in FIG. 3C, after etching the oxide layer 26 using the mask 28 as an etch barrier, predetermined portions of the exposed active region 100 are etched in a predetermined depth to form recess structures 29 in line/space form.

Herein, the depth of the recess structures 29 may be controlled to range from approximately 200 Å to approximately 600 Å to establish a height difference 'D' between first active regions 101 and a second active region 102, wherein the height difference 'D' ranges from approximately 200 Å to 600 Å. Herein, the first active regions 101 are connected to storage nodes, and the second active region 102 is connected to a bit line. That is, the first active regions 101 are formed at lower regions when compared with the second active region 102 by approximately 200 Å to approximately 600 Å.

Thus, by forming the recess structures 29, the first active regions 101 obtain recessed surfaces, and thus, resulting in the first active regions 101 and the second active region 102 to have an asymmetric structure. Hereinafter, the first active regions 101 including the recess structures 29, are referred to as the recessed first active regions 101A.

Figure 3D:
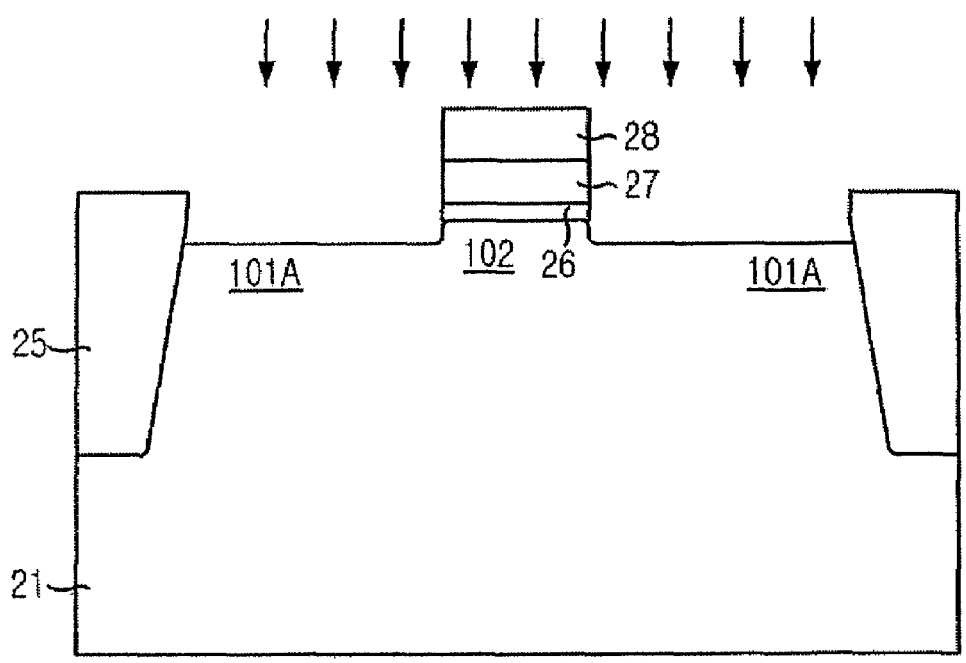

As shown in FIG. 3D, the recessed first active regions 101A are additionally etched while the mask 28 remains. Particularly, this etching utilizes an isotropic etching method to round the top corners of the recessed first active regions 101A. Herein, the top corners refer to the border region between the individual recessed first active region 101A and the second active region 102. Such process is referred to as a chemical dry etching (CDE) process.

Herein, the isotropic etching method for rounding the corners of the recessed first active regions 101A is performed by a down stream method, and utilizes soft etching by microwave plasma or inductively coupled plasma (ICP). For example, the isotropic etching method utilizes one selected from the group consisting of a mixed gas of $CF_4/O_2$, a mixed gas of nitrogen trifluoride ($NF_3$)/$O_2$/helium (He), or a combination thereof, while maintaining the etching rate at approximately 150 Å/min.

During the above isotropic etching rounding process, an additional effect of removing any side silicon stringers may be achieved. Herein, side silicon stringers may be generated at the edges of the recessed first active regions 101A adjacent to the device isolation regions 25.

Figure 3E:
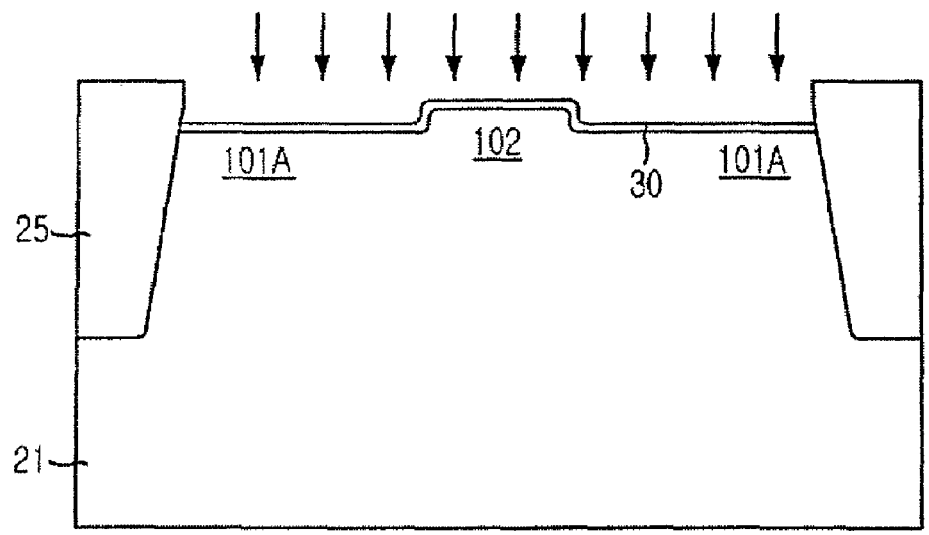

As shown in FIG. 3E, the mask 28 and the organic anti-reflective coating layer 27 are stripped, and the oxide layer 26 is removed. Herein, the mask 28 is formed by employing a photoresist layer, and thus the mask 28 is stripped by utilizing typical oxygen plasma. At this point, the organic anti-reflective coating layer 27 is stripped at the same time. Also, the oxide layer 26 may be removed by utilizing a wet chemical etch, using a solution selected from a group consisting of buffered oxide etchant (BOE) (ammonium fluoride ($NH_4F$): hydrogen fluoride (HF)), HF, and standard clean-1 (SC-1) (ammonium hydroxide ($NH_4OH$):hydrogen peroxide ($H_2O_2$):water ($H_2O$)).

Furthermore, a sacrificial oxide layer 30 is formed on the above resulting substrate structure including the recessed first active regions 101A with the top corners rounded by the isotropic etching. Herein, the sacrificial oxide layer 30 is formed to prevent defects from forming on the surface of the active regions during ion implantation processes i.e., a well region implantation & a threshold voltage implantation. In the threshold voltage implantation, a dopant is implanted with a certain doping concentration level to determine the threshold voltage. Herein, the ion implantation processes are performed to control the well region and the threshold voltage, and the sacrificial oxide layer 30 is formed by employing one of a screen oxide layer and a threshold voltage oxide layer.

The sacrificial oxide layer 30 is formed by a dry oxidation process at approximately 800° C. to approximately 1,000° C. in a thickness ranging from approximately 50 Å to approximately 120 Å.

Next, with the sacrificial oxide layer 30 remaining, the ion implantation processes are performed to control the well region and the threshold voltage.

Figure 3F:
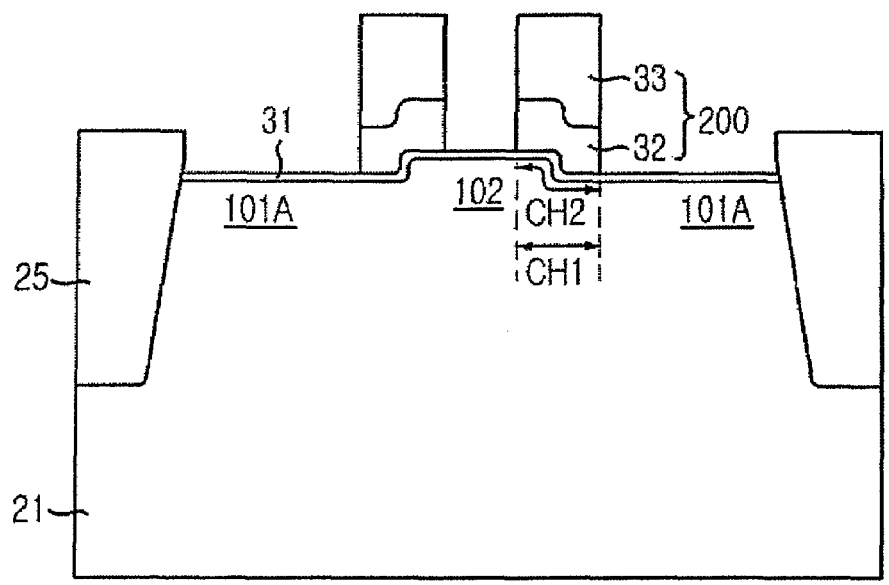

As shown in FIG. 3F, the sacrificial oxide layer 30 is stripped, a gate oxide pre-cleaning process is performed and then a gate oxide layer 31 is formed on the above resulting substrate structure. Herein, the gate oxide layer 31 is formed by employing the dry oxidation process at a temperature ranging from approximately 850° C. to approximately 1,000° C. in a thickness ranging from approximately 100 Å to approximately 150 Å.

Subsequently, gate patterns 200 are formed on the above resulting substrate structure, wherein each of the gate patterns 200 include a gate electrode 32 and a hard mask 33 formed in a sequential order.

The gate patterns 200 are formed across the top surface of the active regions, and since the gate patterns 200 are formed partially over both of the recessed first active regions 101A and the second region 102, the gate patterns 200 have a step-gate structure.

Observing closely at one gate pattern 200, one side of the gate pattern 200 has reached a surface portion of the recessed first active regions 101A, and the other side has reached a surface portion of the second active region 102. The gate patterns 200 are formed on top of the border region between the recessed first active regions 101A and the second active region 102, and thus the gate patterns 200 are not formed having a flat shape, but formed having a step-gate structure.

As described above, the gate patterns 200 are formed over the recessed first active regions 101A and the flat second active region 102 with the step-gate structure, and thus the channel length defined by the gate patterns 200 is longer than the channel length of a conventional flat transistor.

That is, referring to the channel length of a conventional flat transistor as 'CH1' and the channel length of the transistor in accordance with the specific embodiment of the present invention as 'CH2', 'CH2' is longer than 'CH1' by the depth of the recess structures 29.

Figure 3G:
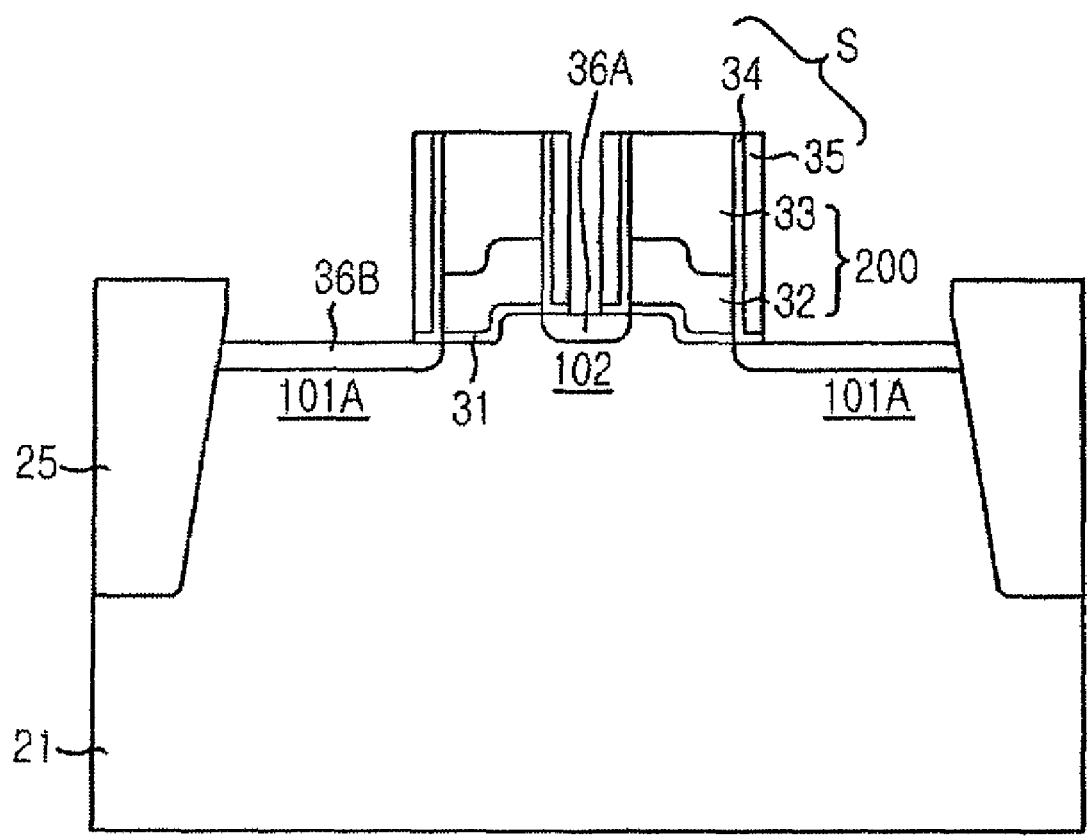

As shown in FIG. 3G, insulation layers, more particularly, an oxide layer 34 and a nitride layer 35, are formed over the gate patterns 200. Herein, the insulation layers work as gate spacers. Then, an etching process is performed to form spacers S. Herein, the spacers S are double gate spacers formed on both lateral walls of the gate patterns 200.

Furthermore, ion implantation of N-type impurities for forming cell junction regions 36A and 36B is performed on the above resulting substrate structure including the gate spacers S. Thus, first cell junction regions 36B are formed between the individual gate pattern 200 and the individual device isolation region 25, and a second cell junction region 36A is formed in the second active region 102 between the gate patterns 200. That is, the first cell junction regions 36B are formed in the recessed first active regions 101A, and the second cell junction region 36A is formed in the second active region 102 which is formed to protrude above the recessed first active regions 101A.

A bit line will be connected to the second cell junction region 36A formed in the second active region 102, and storage nodes will be connected to the first cell junction regions 36B formed in the recessed first active regions 101A.

Accordingly, the cell transistor of this invention includes the gate patterns 200 with a step-gate structure, and the cell transistor is formed having an asymmetric structure, where the first cell junction regions 36B and the second cell junction region 36A and are formed respectively over the recessed first active regions 101A and the second active region 102 with a difference in height. Herein, the second cell junction region 36A works as a source (or a drain), and the first cell junction regions 36B work as drains (or sources). That is, the second active region 102 whereon the bit line is to be connected to is not formed in a recess structure, whereas the first active regions 101A, whereon the storage nodes are to be connected to, are formed in a recess structure.

Figure 4A:
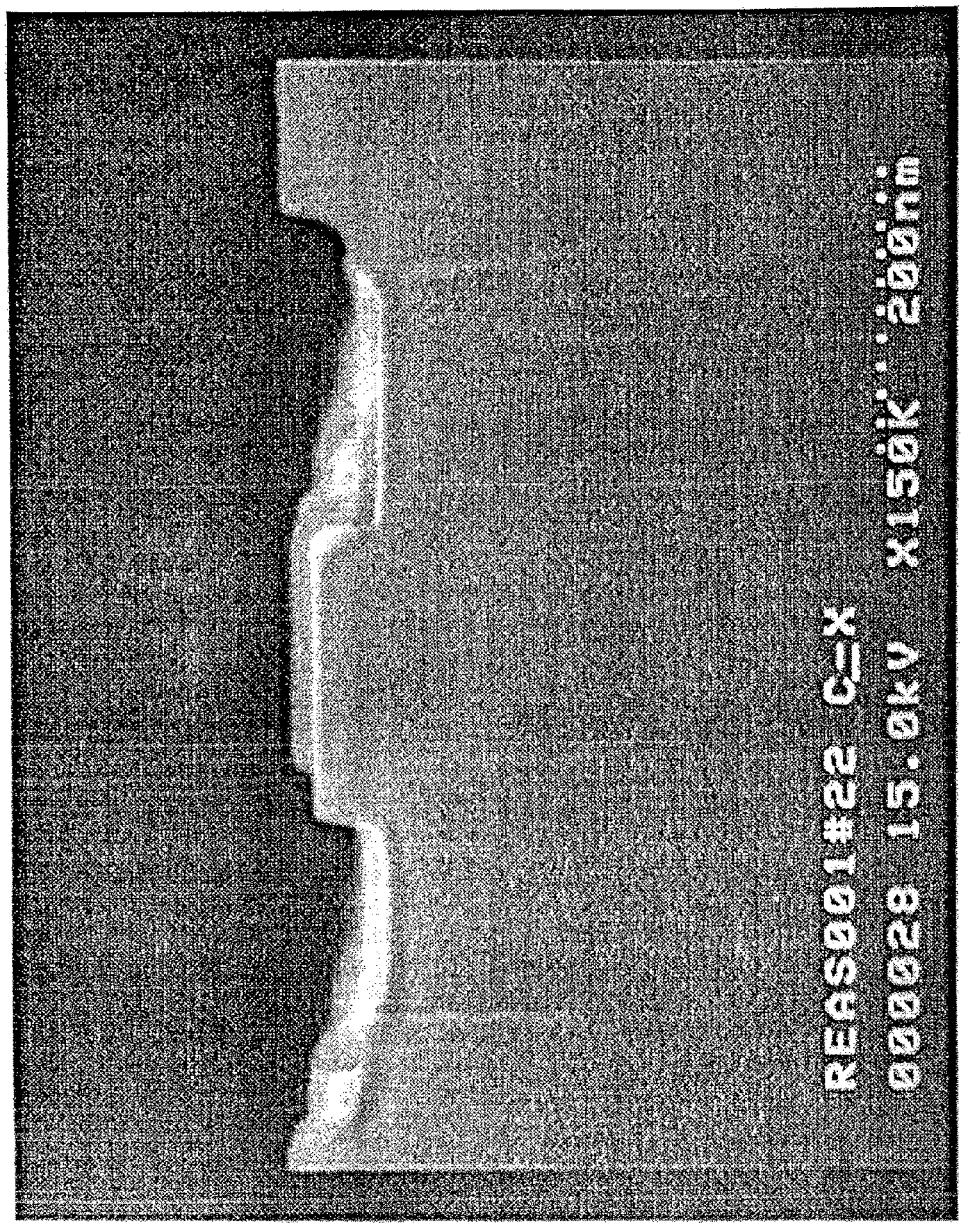
FIGS. 4A to 4C are micrographic images illustrating a recess structure formation consistent with the present invention.
Figure 4B:
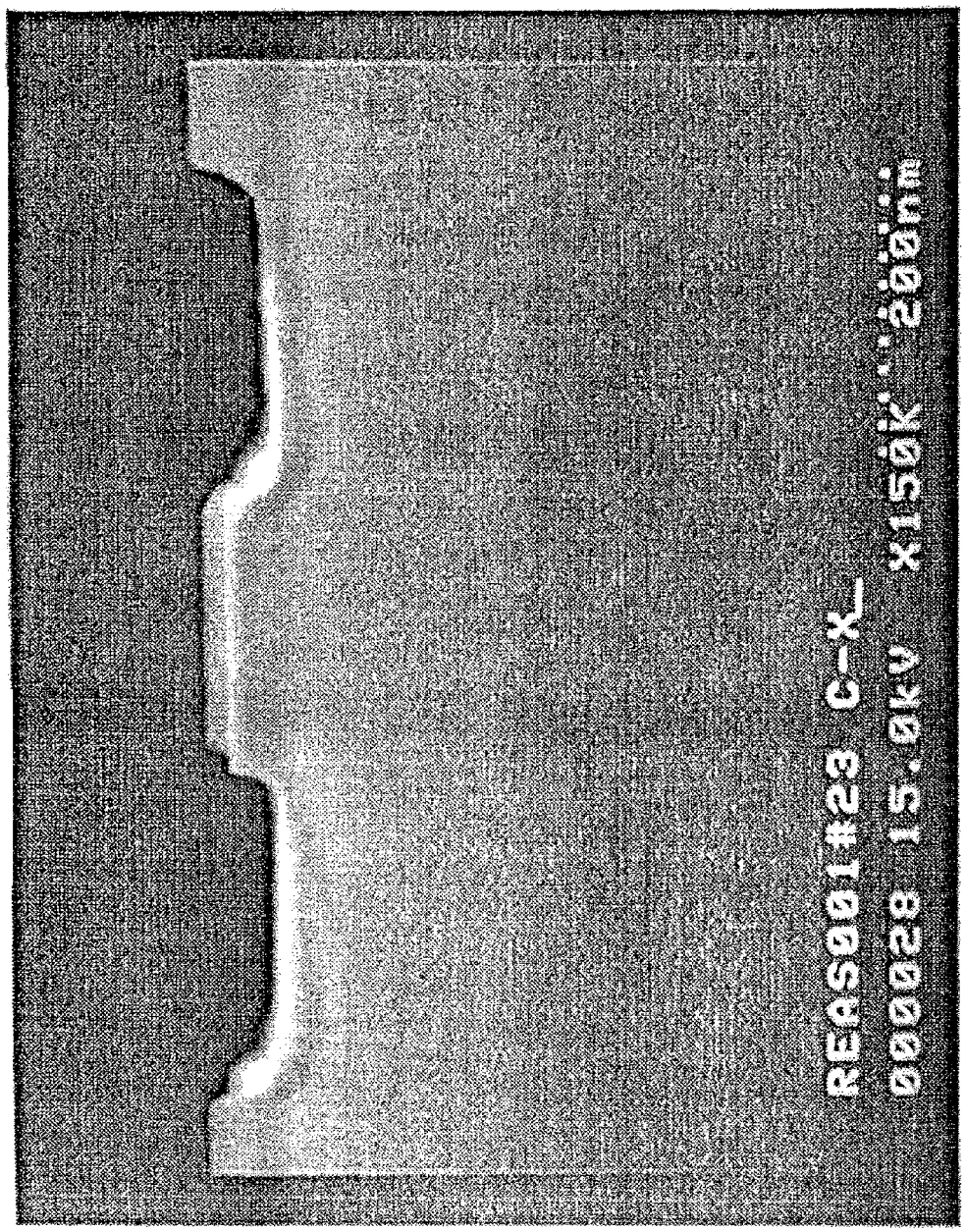
Figure 4C:
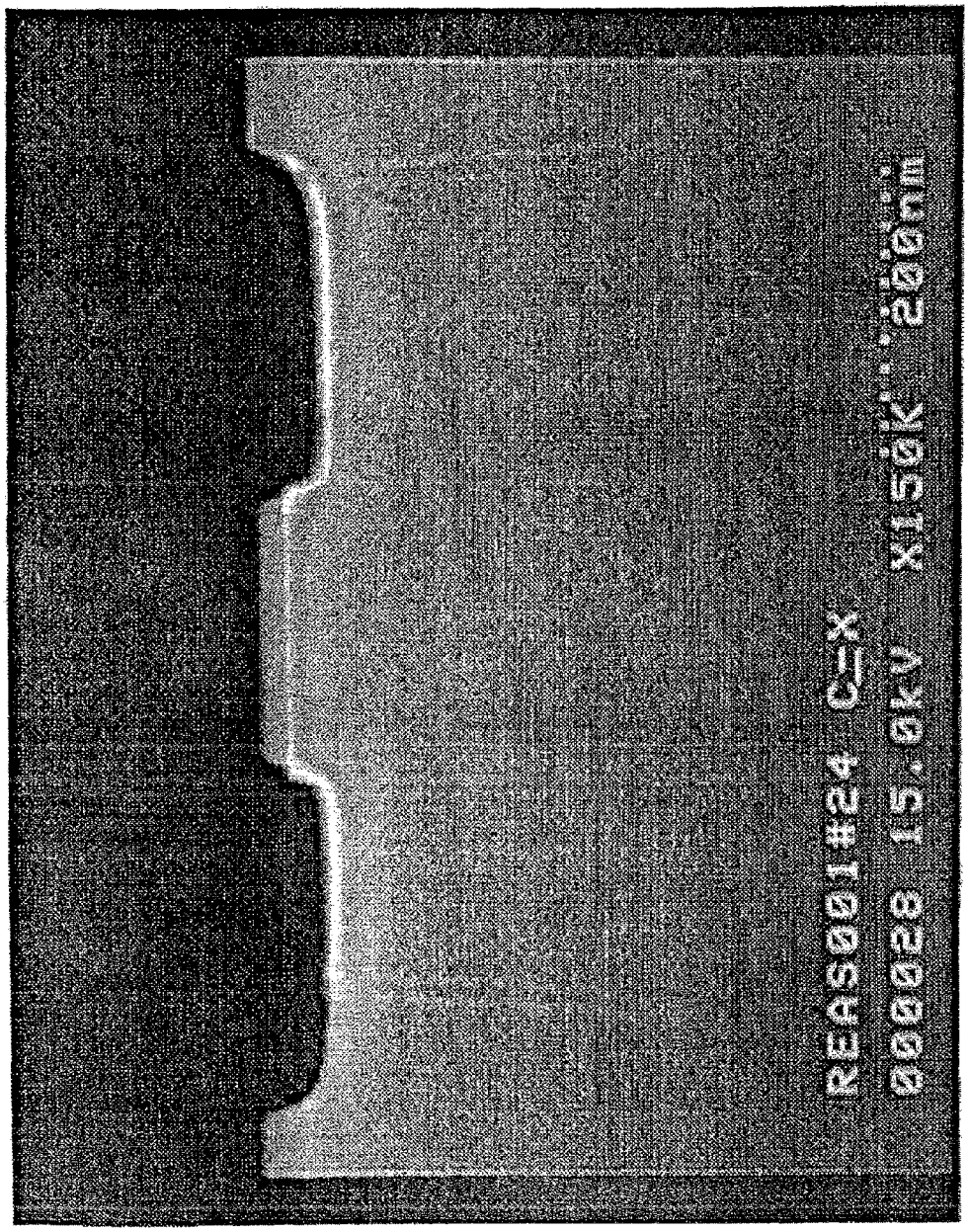

FIGS. 4A to 4C are micrographic images illustrating the formation of a recess structure consistent with an embodiment of the present invention.

Referring to FIG. 4A, recess structures are etched in a depth ranging from approximately 450 Å to approximately 460 Å using approximately 1,300 W of source power and approximately 275 W of bias power.

Referring to FIG. 4B, recess structures are etched in a depth ranging from approximately 360 Å to approximately 380 Å using approximately 15 mtorr of pressure, approximately 800 W of source power and approximately 275 of W bias power. Particularly, FIG. 4B shows device isolation regions adjacent to the recess structures, with flat surfaces identical to the recess structures. Herein, the flat surfaces are caused by an etch selectivity ratio of approximately 1:1 between a photoresist layer used as a mask and an oxide layer used as the device isolation regions.

Referring to FIG. 4C, recess structures are etched in a depth ranging from approximately 270 Å to approximately 280 Å using approximately 15 mtorr of pressure, approximately 800 W of source power and approximately 175 W of bias power.

Thus, a cell transistor is provided with a step-gate structure and an asymmetric structure by forming the first active regions 101A in the recess structure. That is, by forming the channel regions in the step structure defined under the gate patterns 200, and by rounding, a leakage current caused by a leakage of the impurities which are ion implanted in the second cell junction region 36A is prevented, and thus, a refresh characteristic of devices formed with such a structure can be improved.

On the other hand, recessed first active regions 101A and device isolation regions 25 are formed to have different heights ranging from approximately −50 Å to approximately +150 Å. Herein, the height difference between recessed first active regions 101A and device isolation regions 25 is determined by time control of an etching process and several follow-up cleaning processes for forming recess structures 29. Herein, the cleaning processes include CMP follow-up cleaning, oxide layer removal, sacrificial oxide layer removal, and gate oxide pre-cleaning. That is, the gate oxide pre-cleaning process may be performed before forming the gate patterns, and the height difference between first active regions 101A and device isolation regions 25 ranges from approximately −50 Å to approximately +150 Å.

Consistent with an embodiment of the present invention, forming a step-gate structure has the beneficial effect of preventing leakage current of the dopant ion, implanted during the follow-up process, and thus, improves the refresh characteristic.

While the present invention has been described with respect to certain specific embodiments, it will be apparent to those skilled in the art that various changes and modifications may be made without departing from the spirit and scope of the invention as defined in the following claims.

What is the claimed is:

1. A semiconductor device, comprising:
    a substrate having a plurality of first active regions, at least one second active region, and a plurality of device isolation regions;
    gate patterns formed in a step structure over a border region between individual first active regions and the second active region, wherein one side of the individual gate pattern is formed over a portion of the individual first active region, and the other side of the individual gate pattern is formed over a portion of the second active region;
    spacers formed on lateral walls of the gate patterns;
    first cell junction regions formed in the first active regions, for connecting to storage nodes; and
    a second cell junction region formed in the second active region, for connecting to a bit line;
    wherein the border region between the individual first active regions and the second active region is rounded.

2. The device of claim 1, wherein the second active region has a top surface extending above a top surface of the first active regions.

3. The device of claim 1, wherein the first active regions and the second active region have different heights, the difference ranging from approximately 200 Å. to approximately 600 Å.

4. The device of claim 1, wherein a height difference between individual first active regions and individual device isolation regions ranges from approximately −50 Å to approximately +150 Å.

* * * * *